(12) United States Patent
Valadez et al.

(10) Patent No.: US 8,121,366 B2
(45) Date of Patent: Feb. 21, 2012

(54) ALIGNMENT OF FAT-SAT AND NON-FAT-SAT T1 WEIGHTED IMAGES IN MRI APPLICATIONS

(75) Inventors: Gerardo Hermosillo Valadez, West Chester, PA (US); Yoshihisa Shinagawa, Downingtown, PA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 818 days.

(21) Appl. No.: 12/204,935

(22) Filed: Sep. 5, 2008

(65) Prior Publication Data
US 2009/0067751 A1 Mar. 12, 2009

Related U.S. Application Data

(60) Provisional application No. 60/971,326, filed on Sep. 11, 2007.

(51) Int. Cl.
*G06K 9/00* (2006.01)
*G06K 9/62* (2006.01)
(52) U.S. Cl. ........................ 382/128; 382/159
(58) Field of Classification Search .................. None
See application file for complete search history.

(56) References Cited

U.S. PATENT DOCUMENTS

2006/0093209 A1* 5/2006 Guetter et al. ................ 382/159

FOREIGN PATENT DOCUMENTS

WO 2006/023354 A 3/2006

OTHER PUBLICATIONS

Zhang et al., "Multi-modality medical image registration using support vector machines", Annual International Conference of the IEEE Engineering in Medicine and Biology—Proceedings—Proceedings of the 2005 27th Annual International Conference of the Engineering in Medicine and Biology Society, IEEE-EMBS 2005, 2005 Institute of Electric, vol. 7 VOLS, 2005, pp. 6293-6296.
Leventon et al., "Multi-modal volume registration using joint intensity distributions [medical images]", Medical Image Computing and Computer-Assisted Intervention, MICCAI '98. First International Conference, Proceedings, Springer-Verlag Berlin, Germany, 1998, pp. 1057-1066.
Kerslake et al., "Dynamic gradient-echo and fat-suppressed spin-echo contrast-enhanced MRI of the breast", Clinical Radiology, Livingstone, Harlow, GB, vol. 50, No. 7, Jul. 1, 1995, pp. 440-454.
Kwok et al., "Fast breath-hold imaging of the liver with SMASH and interleaved water/fat acquisition", Proceedings of the International Society for Magnetic Resonance in Medicine, Eleventh Scientific Meeting, Jul. 10, 2003, p. 1328.

(Continued)

*Primary Examiner* — Roberto Velez
(74) *Attorney, Agent, or Firm* — Peter Robert Withstandley

(57) ABSTRACT

A method for aligning medical images, including: generating a learned joint distribution of intensities of corresponding voxels of images acquired by a first modality and a second modality, wherein the first and second modalities are different from each other; acquiring a first image of a patient using the first modality; acquiring a second image of the patient using the second modality; and aligning the first and second images based on the learned joint distribution.

26 Claims, 4 Drawing Sheets

OTHER PUBLICATIONS

Pluim et al., "Mutual-Information-Based Registration of Medical Images: A Survey", IEEE Transactions on Medical Imaging, IEEE Service Center, Piscataway, NJ, vol. 22, No. 8, Aug. 1, 2003, pp. 986-1004.

International Search Report including Notification of Transmittal of the International Search Report, International Search Report, and Written Opinion of the International Searching Authority.

* cited by examiner

US 8,121,366 B2

ALIGNMENT OF FAT-SAT AND NON-FAT-SAT T1 WEIGHTED IMAGES IN MRI APPLICATIONS

CROSS-REFERENCE TO RELATED APPLICATION

This application claims the benefit of U.S. Provisional Application No. 60/971,326, filed Sep. 11, 2007, the disclosure of which is incorporated by reference herein in its entirety.

BACKGROUND OF THE INVENTION

1. Technical Field

The present invention relates to the registration of images acquired using different imaging techniques, and more specifically, to the alignment of fat saturated and non-fat saturated T1 weighted images.

2. Discussion of the Related Art

Fat saturation (also known as "fat suppression") techniques are often used in Dynamic Contrast Enhanced Magnetic Resonance Imaging (DCE MRI). Fat saturation techniques eliminate the otherwise high intensity signal obtained from fat that makes the interpretation of abnormal enhancements difficult.

Non-fat saturated images are also useful in the interpretation of DCE MRI because in the non-fat saturated images, normal glandular tissue (e.g., breast tissue) appears dark and allows normal enhancements to be distinguished.

DCE MRI produces 3D anatomical structure information of tissues. The analysis of tissue voxel intensities produced by DCE MRI provides a noninvasive assessment of the tissue characteristics.

The T1 relaxation time is a biological parameter that is used in MRIs to distinguish between tissue types. This tissue-specific time constant for protons, is a measure of the time taken to realign with the external magnetic field. The T1 constant will indicate how quickly the spinning nuclei will emit their absorbed RF into the surrounding tissue.

As the high-energy nuclei relax and realign, they emit energy that is recorded to provide information about their environment. The realignment with the magnetic field is termed longitudinal relaxation and the time in milliseconds required for a certain percentage of the tissue nuclei to realign is termed "Time 1" or T1.

Starting from zero magnetization in the Z direction, the Z magnetization will grow after excitation from zero to a value of about 63% of its final value in a time of T1. This is the basic of T1 weighted images.

The T1 time is a contrast determining tissue parameter. For example, the slow molecular motion of fat nuclei results in a short T1 time. In contrast, the high mobility of water molecules results in a long T1 time.

The term T1-weighted is used to indicate an image where most of the contrast between tissues is due to differences in the T1 value.

T1 fat saturated images and T1 non-fat saturated images acquired from the same patient are often misaligned because of the patient's movement (e.g., rotation) during the MRI.

For a computer aided diagnosis or detection system with access to images obtained using different imaging techniques, it is important to accurately align all structures in both images to take advantage of their complementary information.

SUMMARY OF THE INVENTION

In an exemplary embodiment of the present invention, a method for aligning medical images, comprises: generating a learned joint distribution of intensities of corresponding voxels of images acquired by a first modality and a second modality, wherein the first and second modalities are different from each other; acquiring a first image of a patient using the first modality; acquiring a second image of the patient using the second modality; and aligning the first and second images based on the learned joint distribution.

The first and second modalities are magnetic resonance and computed tomography imaging techniques, respectively.

The first and second modalities are first and second magnetic resonance imaging protocols, respectively, that are different from each other.

The first and second modalities are first and second computed tomography imaging protocols, respectively, that are different from each other.

The first image is a fat saturated image.

The second image is a non-fat saturated image.

The learned joint distribution is generated during an offline process.

The generation of the learned joint distribution during the offline process includes: acquiring a pair of learning images, wherein one image is acquired with the first modality and the other image is acquired with the second modality; manually aligning the learning images to produce a first joint distribution; and generating the learned joint distribution based on the first joint distribution.

The generation of the learned distribution further includes: acquiring another pair of learning images wherein one image is acquired with the first modality and the other image is acquired with the second modality; manually aligning the another pair of learning images to produce a second joint distribution; and updating the learned joint distribution with the second joint distribution.

The updating is performing using an averaging technique.

The first and second images are aligned during an inline process.

The inline process automatically aligns the first and second images by maximizing the likelihood of the corresponding voxel intensities of the first and second images according to the learned joint distribution.

The maximization of the likelihood is performed using an optimization algorithm.

In an exemplary embodiment of the present invention, a system for aligning medical images, comprises: a memory device for storing a program; a processor in communication with the memory device, the processor operative with the program to: generate a learned joint distribution of intensities of corresponding voxels of images acquired by a first modality and a second modality, wherein the first and second modalities are different from each other; acquire a first image of a patient using the first modality; acquire a second image of the patient using the second modality; and align the first and second images based on the learned joint distribution.

The first and second modalities are magnetic resonance and computed tomography imaging techniques respectively.

The first and second modalities are first and second magnetic resonance imaging protocols, respectively that are different from each other.

The first and second modalities are first and second computed tomography imaging protocols, respectively, that are different from each other.

The first image is a fat saturated image.

The second image is a non-fat saturated image.

The learned joint distribution is generated during an offline process.

The processor is further operative with the program when generating the learned joint distribution during the offline process to: acquire a pair of learning images, wherein one image is acquired with the first modality and the other image is acquired with the second modality; receive data resulting from manual alignment of the learning images to produce a first joint distribution; and generate the learned joint distribution based on the first joint distribution.

The processor is further operative with the program when generating the learned joint distribution during the offline process to: acquire another pair of learning images, wherein one image is acquired with the first modality and the other image is acquired with the second modality; received data resulting from manual alignment of the another pair of learning images to produce a second joint distribution; and update the learned joint distribution with the second joint distribution.

The updating is performing using an averaging technique.

The first and second images are aligned during an inline process

The inline process automatically aligns the first and second images by maximizing the likelihood of the corresponding voxel intensities of the first and second images according to the learned joint distribution.

The maximization of the likelihood is performed using an optimization algorithm.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description from the drawings and from the claims.

DETAILED DESCRIPTION OF EXEMPLARY EMBODIMENTS

Exemplary embodiments of the present invention seek to provide a method and system for aligning fat saturated and non-fat saturated T1 weighted images in MRI (e.g. DCE MRI) of CT applications. The images may be of breast tissue, for example.

The fat saturated images and non-fat saturated images are often misaligned because of the patient's movement, e.g., body rotation, during the imaging process.

Figure 1:
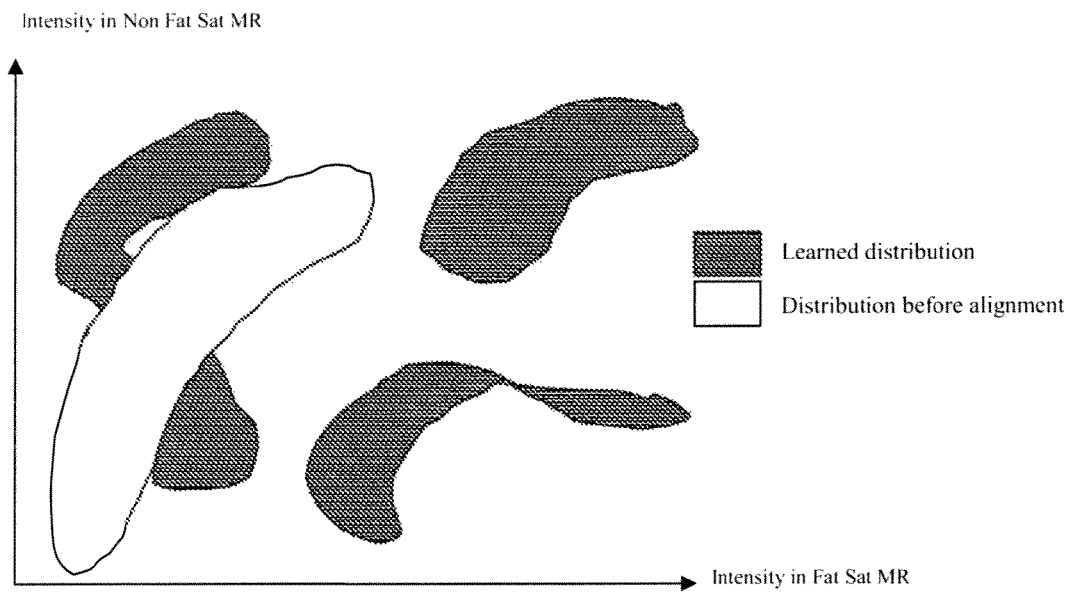
FIG. 1 is a diagram showing a distribution of voxel intensities in fat saturated images versus non-fat saturated images, according to an exemplary embodiment of the present invention.

FIG. 1 is a diagram showing a distribution of voxel intensities in fat saturated images versus non-fat saturated images, according to an exemplary embodiment of the present invention.

Two sets of joint distributions are shown in FIG. 1, a joint distribution before alignment and a learned joint distribution.

For a given pair of images a joint distribution is computed by visiting corresponding voxels in each image and recording the intensity values. The value pair at a given voxel location gives a pair of coordinates for which a counter is incremented. This is called the joint histogram computation. A smooth version of this joint histogram is then computed as an estimate of the joint distribution. The learned joint distribution shown in FIG. 1 is assumed to be close to the ideal distribution of intensities when the alignment is perfect. When the alignment is not perfect, the distribution of intensities will have a different shape (for example, the joint distribution before alignment shown in FIG. 1) and the corresponding likelihood of the intensity pairs as measured by the learned distribution will be low. As the alignment improves, the joint distribution of the images being aligned more closely resembles the learned distribution and the likelihood of the intensity pairs increases. FIG. 1 shows the process in a stage in which both distributions are still quite different. Thus, a better alignment is required.

Figure 2:
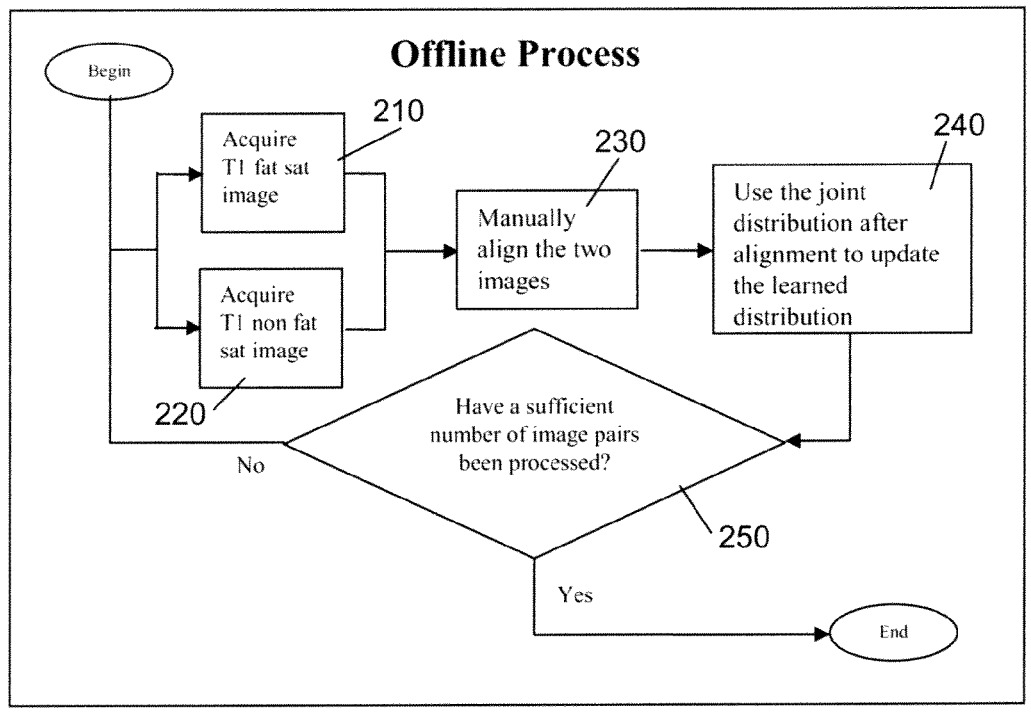
FIG. 2 is block diagram of an offline process, according to an exemplary embodiment of the present invention.

The learned joint distribution before alignment is obtained by an offline process, as shown in FIG. 2.

In Step 210 a T1 weighted fat saturated image is acquired, and in Step 220 a T1 weighted non-fat saturated image is acquired. Although not shown, many different medical image types may be acquired in Steps 210 and 220.

In Step 230 the two complementary images are manually aligned using known techniques including the manipulation of deformation model parameters. For example, the user may be given a graphical user interface that allows him to adjust the parameters of the deformation model and visually assess the quality of the matching.

In Step 240 the joint distribution after alignment, that is, what was done to align the images (e.g., a rotation) is used to update the learned distribution. The update of the learned distribution may be performed by using averaging techniques, for example. As the number of training alignments increases, the variability in the joint distribution after alignment is expected to decrease and the mean or median distribution is expected to approach the "real" distribution. Averaging means that the "final" learned distribution may simply be the average of all distributions obtained after the manual alignments.

In Step 250, an assessment is made as to whether a sufficient number of image pairs have been processed to produce an adequate learned distribution. Generally, the larger the number of image pairs that can be processed, the better the learned distribution will be.

Figure 3:
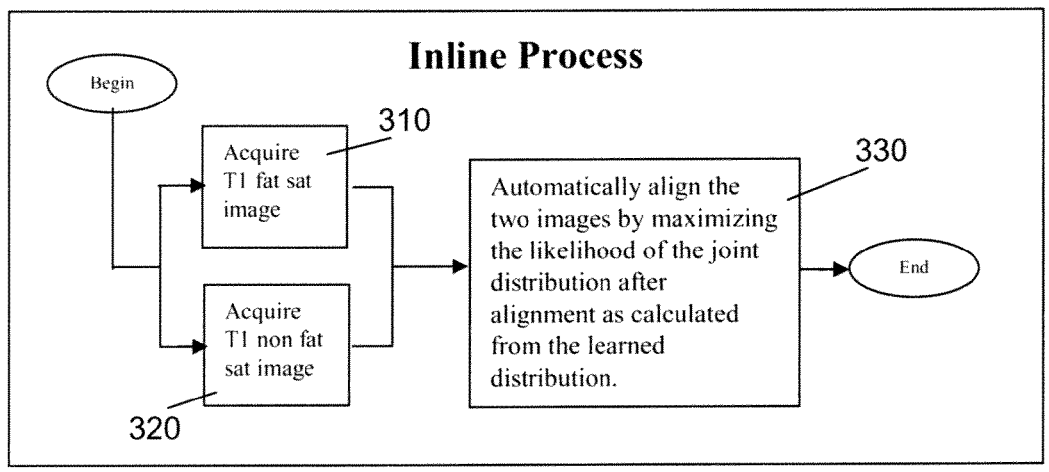
FIG. 3 is a block diagram of an inline process, according to an exemplary embodiment of the present invention.

FIG. 3 illustrates the inline process performed after an adequate learned distribution has been obtained using the offline process of FIG. 2.

In Step 310 a T1 weighted fat saturated image is acquired and in Step 320 a T1 weighted non-fat saturated image is acquired and a joint distribution before alignment is generated. It is noted that many different medical image types may be acquired in Steps 310 and 320. In the inline process, the images are obtained from one patient. In contrast, in the offline process described in FIG. 2, the images are obtained from multiple patients.

In Step 330 the joint distribution diagram of FIG. 1 is used to automatically align the two images by maximizing the likelihood of a joint distribution after alignment using the learned distribution, using optimization algorithms. The optimization algorithms are designed to deform one of the images such as to maximize the similarity between the joint distribution after deformation and the closest cluster in the learned distribution. Accordingly, an iterative process is defined in which candidate deformations are applied and standard optimization techniques such as hill climbing are applied. The measure of success is defined as the likelihood of the image intensity pairs given a deformation.

For example, if the joint distribution before alignment shown in FIG. 1 is rotated counterclockwise to match the closest cluster in the learned distribution, the likelihood of the joint distribution after alignment is maximized.

Figure 4:
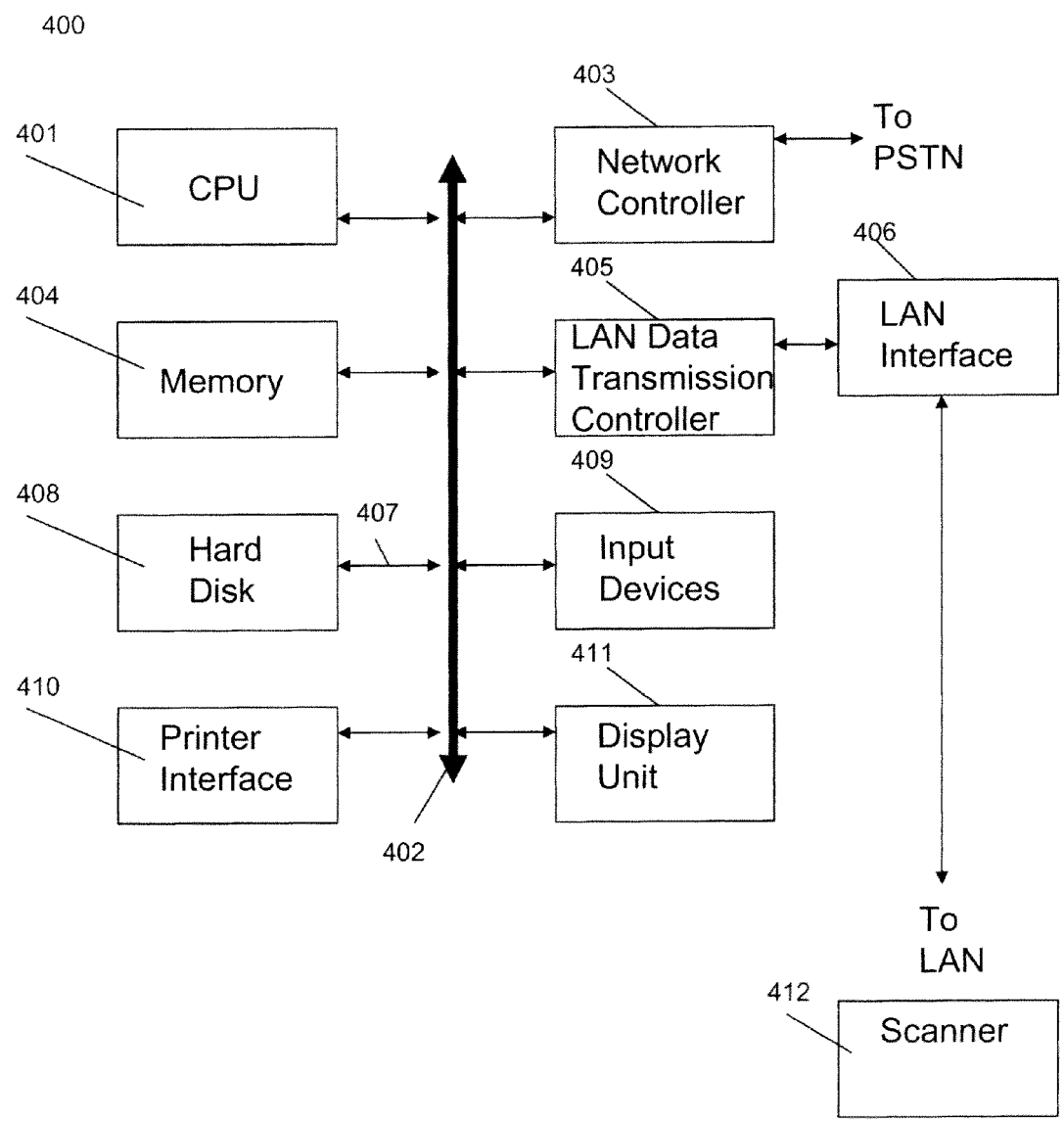
FIG. 4 shows an example of a computer system capable of implementing a method and apparatus according to exemplary embodiments of the present invention.

FIG. 4 shows an example of a computer system which may implement a method and system of exemplary embodiments of the present invention. The system and method of the present invention may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 400 may include, for example, a central processing unit (CPU) 401, memory 404, a printer interface 410, a display unit 411, a local area network (LAN) data transmission controller 405, a LAN interface 406, a network controller 403, an internal bus 402, and one or more input devices 409, for example, a keyboard, mouse etc. As shown, the system 400 may be connected to a data storage device, for example, a hard disk, 408 via a link 407. The system 400 may also be connected to a scanner 412 via the LAN interface 406 or directly thereto.

It is to be understood that the present invention may be implemented in various forms of hardware, software, firmware, special purpose processors, or a combination thereof. In one embodiment, the present invention may be implemented in software as an application program tangibly embodied on a program storage device (e.g., magnetic floppy disk, RAM, CD ROM, DVD, ROM, and flash memory). The application program may be uploaded to, and executed by, a machine comprising any suitable architecture.

It should also be understood that because some of the constituent system components and method steps depicted in the accompanying figures may be implemented in software, the actual connections between the system components (or the process steps) may differ depending on the manner in which the present invention is programmed. Given the teachings of the present invention provided herein, one of ordinary skill in the art will be able to contemplate these and similar implementations or configurations of the present invention.

It is to be further understood that the above description is only representative of illustrative embodiments. For convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A method for aligning medical images, comprising:
    manually aligning a first pair of learning images acquired by first and second modalities to produce a first joint distribution, wherein the first and second modalities are different from each other;
    generating, by the processor, a learned joint distribution based on the first joint distribution;
    manually aligning a second pair of learning images acquired by the first and second modalities to produce a second joint distribution;
    updating, by the processor, the learned joint distribution with the second joint distribution;
    acquiring, using the first modality, a first image of a patient;
    acquiring, using the second modality, a second image of the patient; and
    aligning, by the processor, the first and second images based on the learned joint distribution.

2. The method of claim 1, wherein the first and second modalities are magnetic resonance and computed tomography imaging techniques, respectively.

3. The method of claim 1, wherein the first and second modalities are first and second magnetic resonance imaging protocols, respectively, that are different from each other.

4. The method of claim 1, wherein the first and second modalities are first and second computed tomography imaging protocols, respectively, that are different from each other.

5. The method of claim 1, wherein the first image is a fat saturated image.

6. The method of claim 1, wherein the second image is a non-fat saturated image.

7. The method of claim 1, wherein the learned joint distribution is generated during an offline process.

8. The method of claim 7, wherein the generation of the learned joint distribution during the offline process includes:
    acquiring, using the first modality, one image of the first pair of learning images; and
    acquiring, using the second modality, another image of the first pair of learning images.

9. The method of claim 8, wherein the generation of the learned joint distribution during the offline process further includes:
    acquiring, using the first modality, one image of the second pair of learning images; and
    acquiring, using the second modality, another image of the second pair of learning images.

10. The method of claim 1, wherein the updating is performing using an averaging technique.

11. The method of claim 1, wherein the first and second images are aligned during an inline process.

12. The method of claim 11, wherein the inline process automatically aligns the first and second images by maximizing the likelihood of the corresponding voxel intensities of the first and second images according to the learned joint distribution.

13. The method of claim 12, wherein the maximization of the likelihood is performed using an optimization algorithm.

14. A system for aligning medical images, comprising:
    a memory device for storing a program;
    a processor in communication with the memory device, the processor operative with the program to:
        receive data resulting from manual alignment of a first pair of learning images acquired by first and second modalities to produce a first joint distribution, wherein the first and second modalities are different from each other;

generate a learned joint distribution based on the first joint distribution;

receive data resulting from manual alignment of a second pair of learning images acquired by the first and second modalities to produce a second joint distribution;

update the learned joint distribution with the second joint distribution;

acquire a first image of a patient using the first modality;

acquire a second image of the patient using the second modality; and align the first and second images based on the learned joint distribution.

15. The system of claim 14, wherein the first and second modalities are magnetic resonance and computed tomography imaging techniques, respectively.

16. The system of claim 14, wherein the first and second modalities are first and second magnetic resonance imaging protocols, respectively, that are different from each other.

17. The system of claim 14, wherein the first and second modalities are first and second computed tomography imaging protocols, respectively, that are different from each other.

18. The system of claim 14, wherein the first image is a fat saturated image.

19. The system of claim 14, wherein the second image is a non-fat saturated image.

20. The system of claim 14, wherein the learned joint distribution is generated during an offline process.

21. The system of claim 20, wherein the processor is further operative with the program when generating the learned joint distribution during the offline process to:

acquire, using the first modality, one image of the first pair of learning images; and acquire, using the second modality, another image of the first pair of learning images.

22. The system of claim 21, wherein the processor is further operative with the program when generating the learned joint distribution during the offline process to:

acquire, using the first modality, one image of the second pair of learning images; and acquire, using the second modality, another image of the second pair of learning images.

23. The system of claim 14, wherein the updating is performing using an averaging technique.

24. The system of claim 14, wherein the first and second images are aligned during an inline process.

25. The system of claim 24, wherein the inline process automatically aligns the first and second images by maximizing the likelihood of the corresponding voxel intensities of the first and second images according to the learned joint distribution.

26. The system of claim 25, wherein the maximization of the likelihood is performed using an optimization algorithm.

* * * * *